United States Patent
Kamai et al.

(10) Patent No.: US 7,839,608 B2
(45) Date of Patent: Nov. 23, 2010

(54) TUNNEL-TYPE MAGNETIC DETECTING DEVICE HAVING LAMINATED SEED LAYER

(75) Inventors: Kazumi Kamai, Ishikawa-ken (JP); Naoya Hasegawa, Niigata-ken (JP); Eiji Umetsu, Niigata-ken (JP); Kazuaki Ikarashi, Niigata-ken (JP)

(73) Assignee: TDK Corporation, Tokyo (JP)

( * ) Notice: Subject to any disclaimer, the term of this patent is extended or adjusted under 35 U.S.C. 154(b) by 919 days.

(21) Appl. No.: 11/623,682

(22) Filed: Jan. 16, 2007

(65) Prior Publication Data

US 2007/0165338 A1 Jul. 19, 2007

(30) Foreign Application Priority Data

Jan. 18, 2006 (JP) ............... 2006-009689

(51) Int. Cl.
*G11B 5/127* (2006.01)
*G11B 5/33* (2006.01)

(52) U.S. Cl. .................................. 360/324.2

(58) Field of Classification Search .............. 360/324.1, 360/324.11, 324.12, 324.2
See application file for complete search history.

(56) References Cited

U.S. PATENT DOCUMENTS

| | | | | |
|---|---|---|---|---|
| 6,208,492 B1 * | 3/2001 | Pinarbasi | ............... | 360/324.11 |
| 6,219,208 B1 * | 4/2001 | Gill | ........................ | 360/324.1 |
| 6,452,763 B1 * | 9/2002 | Gill | ........................ | 360/324.11 |
| 6,456,469 B1 * | 9/2002 | Gill | ........................ | 360/324.11 |
| 6,700,755 B2 * | 3/2004 | Pinarbasi | ............... | 360/324.11 |
| 6,785,102 B2 * | 8/2004 | Freitag et al. | .......... | 360/324.11 |
| 6,862,158 B2 * | 3/2005 | Hasegawa et al. | ...... | 360/324.11 |
| 6,888,706 B2 * | 5/2005 | Ooshima | ............... | 360/324.12 |
| 7,119,997 B2 * | 10/2006 | Freitag et al. | .......... | 360/324.11 |
| 2002/0024778 A1 * | 2/2002 | Xue et al. | ................ | 360/324.1 |
| 2004/0067389 A1 | 4/2004 | Hasegawa et al. | | |
| 2004/0165321 A1 | 8/2004 | Hasegawa et al. | | |
| 2005/0068692 A1 * | 3/2005 | Freitag et al. | .......... | 360/324.11 |
| 2005/0068693 A1 * | 3/2005 | Freitag et al. | .......... | 360/324.11 |
| 2005/0141146 A1 * | 6/2005 | Pinarbasi | ................ | 360/324.1 |

FOREIGN PATENT DOCUMENTS

| | | |
|---|---|---|
| JP | 2002-232035 | 8/2002 |
| JP | 2002-299726 | 10/2002 |
| JP | 2003-174217 | 6/2003 |
| JP | 2004-186659 | 7/2004 |
| JP | 2004-259914 | 9/2004 |
| JP | 2005-203572 | 7/2005 |

* cited by examiner

*Primary Examiner*—Brian E Miller
(74) *Attorney, Agent, or Firm*—Brinks Hofer Gilson & Lione

(57) ABSTRACT

A tunnel-type magnetic detecting device is provided. The tunnel-type magnetic detecting device is capable of stably reducing the surface roughness of an insulating barrier layer, and capable of properly improving an MR effect typified by a resistance changing rate. A seed layer is formed in a laminated structure of an NiFeCr layer and an Al layer. This makes it possible to stably reduce the surface roughness of the insulating barrier layer as compared with a related art in which a seed layer is formed in a single-layer structure of an NiFeCr layer. Accordingly, according to the tunnel-type magnetic detecting device of the invention, the MR property typified by an excellent resistance changing rate ($\Delta R/R$) can be obtained stably.

8 Claims, 4 Drawing Sheets

TUNNEL-TYPE MAGNETIC DETECTING DEVICE HAVING LAMINATED SEED LAYER

This Patent Document claims the benefit of Japanese Patent Application No. 2006-009689 filed on Jan. 18, 2006, which is hereby incorporated by reference.

BACKGROUND

1. Field

The embodiments relate to a tunnel-type magnetic detecting device using a tunnel magnetoresistive effect (TMR effect).

2. Related Art

Japanese Unexamined Patent Application Publication Nos. 2005-203572, 2003-174217, 2003-299726, and 2002-232035 disclose a spin-valve-type thin film device in which a seed layer of NiFeCr is formed below a magnetoresistive effect part having an antiferromagnetic layer, a fixed magnetic layer, a nonmagnetic material layer, and a free magnetic layer.

It is described in Paragraph [0042] of Japanese Unexamined Patent Application Publication No. 2005-203572 that "It is preferable that the seed layer 33 has a single-layer structure of a magnetic material layer or a nonmagnetic material layer which is preferentially oriented to the (111) plane of a face-centered cubic crystal or the (110) plane of a body-centered cubic crystal. Thereby, the crystals of the antiferromagnetic layer 34 can be preferentially oriented to the (111) plane, and the resistance changing rate of the magnetic detecting device can be enhanced."

In the tunnel-type magnetic detecting device, in order to improve the MR property typified by the resistance changing rate ($\Delta R/R$), it was important to reduce the surface roughness of an insulating barrier layer while improving the crystal orientation property of each layer.

Generally, a small surface roughness can be improved, for example, if the film thickness of the insulating barrier layer is properly adjusted to some degree. However, there was no probability of obtaining a small surface roughness always stably because it required very severe film thickness control or the like.

The related art does not disclose reducing the surface roughness of the insulating barrier layer as an object of the disclosed embodiments.

SUMMARY

The present embodiments may obviate one or more of the limitations or drawbacks inherent in the related art. For example, in one embodiment, a tunnel-type magnetic detecting device is capable of stably reducing the surface roughness of an insulating barrier layer, and is capable of properly improving an MR effect typified by a resistance changing rate ($\Delta R/R$).

In one embodiment, a tunnel-type magnetic detecting device includes a magnetoresistive effect part having a fixed magnetic layer whose magnetization direction is fixed in a predetermined direction, and a free magnetic layer which faces the fixed magnetic layer with an insulating barrier layer therebetween and which varies in magnetization by an external magnetic field. A seed layer is provided below the magnetoresistive effect part. In this embodiment, the seed layer is formed in a structure in which an Al layer is laminated on an NiFeCr layer.

This embodiment makes it possible to stably reduce the surface roughness of the insulating barrier layer as compared with the related art in which a seed layer is formed in a single-layer structure of an NiFeCr layer. In one embodiment, the MR property typified by an excellent resistance changing rate ($\Delta R/R$) can be obtained stably.

In one embodiment, a tunnel-type magnetic detecting device includes a magnetoresistive effect part having a fixed magnetic layer whose magnetization direction is fixed in a predetermined direction, and a free magnetic layer which faces the fixed magnetic layer with an insulating barrier layer therebetween and which varies in magnetization by an external magnetic field. A seed layer is provided below the magnetoresistive effect part. In one embodiment, the seed layer includes a Co layer is laminated on an NiFeCr layer, and an Al layer is laminated on the Co layer.

This embodiment makes it possible to stably reduce the surface roughness of the insulating barrier layer as compared with the related art in which a seed layer is formed in a single-layer structure of an NiFeCr layer. In one embodiment, the MR property typified by an excellent resistance changing rate ($\Delta R/R$) can be obtained stably.

In another embodiment, a tunnel-type magnetic detecting device includes a magnetoresistive effect part having a fixed magnetic layer whose magnetization direction is fixed in a predetermined direction, and a free magnetic layer which faces the fixed magnetic layer with an insulating barrier layer therebetween and which varies in magnetization by an external magnetic field. A seed layer is provided below the magnetoresistive effect part. In this embodiment, the seed layer is formed mainly of NiFeCr, and the average concentration of Al in a surface region of the seed layer is higher than the average concentration of Al in a seed region below the surface region.

This also makes it possible to stably reduce the surface roughness of the insulating barrier layer as compared with the related art in which a seed layer is formed in a single-layer structure of an NiFeCr layer. In this embodiment, the MR property typified by an excellent resistance changing rate ($\Delta R/R$) can be obtained stably.

In another embodiment, a tunnel-type magnetic detecting device includes a magnetoresistive effect part having a fixed magnetic layer whose magnetization direction is fixed in a predetermined direction, and a free magnetic layer which faces the fixed magnetic layer with an insulating barrier layer therebetween and which varies in magnetization by an external magnetic field. A seed layer is provided below the magnetoresistive effect part. In this embodiment, the seed layer is formed mainly of NiFeCr, a high-concentration Co region and a high-concentration Al region provided above the high-concentration Co region exist in a surface region of the seed layer. The average concentration of Co in the high-concentration Co region is higher than the average concentration of Co in a seed layer below the high-concentration Co region. The average concentration of Al in the high-concentration Al region is higher than the average concentration of Al in a seed region below the high-concentration Al region.

This embodiment also makes it possible to stably reduce the surface roughness of the insulating barrier layer as compared with the related art in which a seed layer is formed in a single-layer structure of an NiFeCr layer. In one embodiment, the MR property typified by an excellent resistance changing rate ($\Delta R/R$) can be obtained stably.

In one embodiment, the surface roughness of the insulating barrier layer can be reduced stably as compared with the related art in which a seed layer is formed in a single-layer structure of an NiFeCr layer. In this embodiment, the MR property typified by an excellent resistance changing rate ($\Delta R/R$) can be obtained stably.

DETAILED DESCRIPTION

Figure 1:
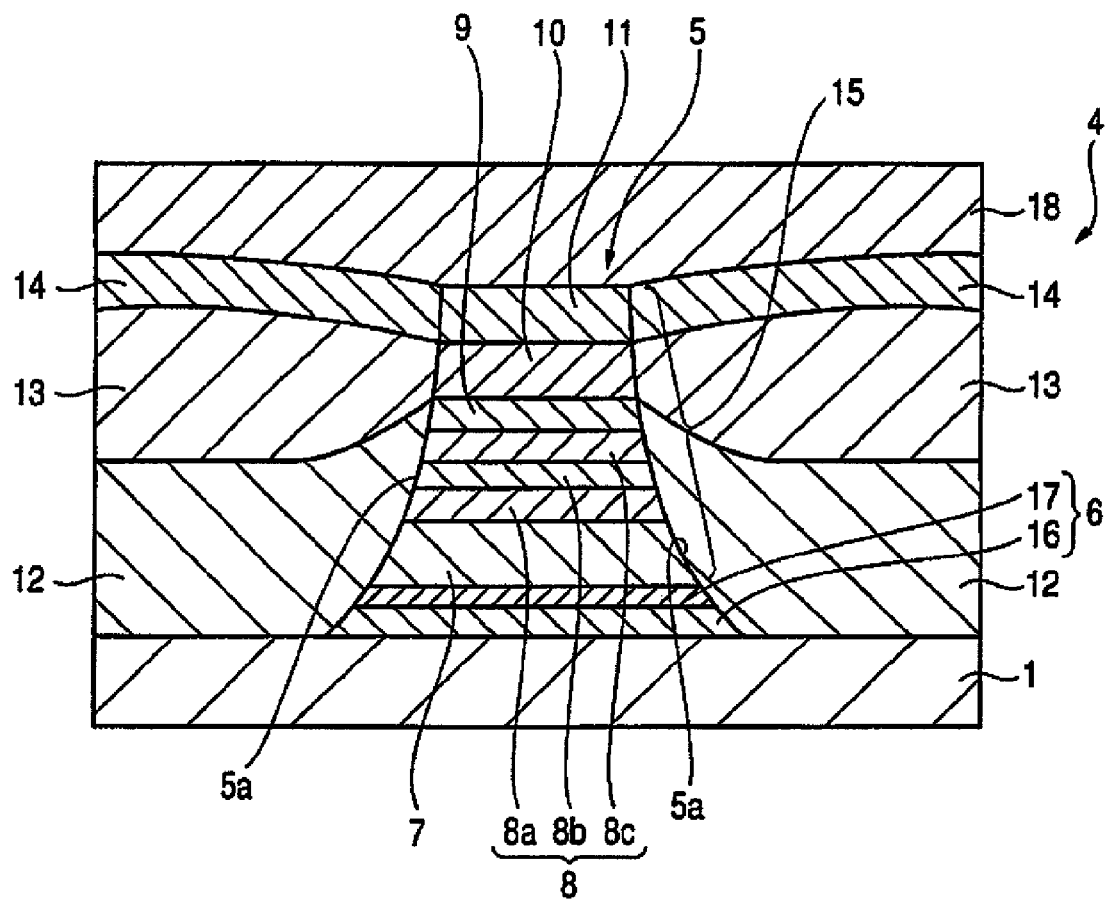
FIG. 1 is a sectional view of one embodiment of the structure of a thin film magnetic head including a tunnel-type magnetic detecting device.
Figure 1:
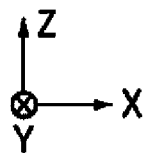

FIG. 1 is a sectional view of a thin film magnetic head (reproducing head) including a tunnel-type magnetic detecting device according to the present embodiment when being cut along a plane which is parallel to a surface facing a recording medium.

The tunnel-type magnetic detecting device is provided at a trailing end of a floating-type slider provided in a hard disk apparatus to detect a recording magnetic field of, for example, a hard disk, or to be used for an MRAM (magnetoresistive memory).

In the drawings, the X-direction denotes a track width direction. In the drawings, the Y-direction denotes a height direction. In the drawings, the Z-direction denotes a depth direction. The Z-direction is the moving direction of a magnetic recording medium, such as a hard disk, and the laminating direction of each layer of the tunnel-type magnetic detecting device. Each of the track width direction, the height direction, and the depth direction is in a orthogonal relation to the remaining two directions. The 'surface facing a recording medium' is a surface in a direction parallel to an X-Z plane.

In one embodiment, a lower shielding layer 1 formed of a magnetic material, such as an NiFe alloy, is formed in the lowest position of FIG. 1. On the lower shielding layer 1, a tunnel-type magnetic detecting device 4 is formed. A laminate 5 is formed in a middle part of the tunnel-type magnetic detecting device 4 in the track width direction (X-direction in the drawing).

The laminate 5 has a seed layer 6, and a magnetoresistive effect part 15.

The seed layer 6 has a laminated structure of an NiFeCr layer 16, and an Al layer 17 formed on the NiFeCr layer 16.

In one embodiment, the magnetoresistive effect part 15 is composed of an antiferromagnetic layer 7, a fixed magnetic layer 8, an insulating barrier layer 9, a free magnetic layer 10, and a protective layer 11 from the bottom.

The antiferromagnetic layer 7 is formed of an antiferromagnetic material including an element X (where X is at least one or two kinds of elements among Pt, Pd, Ir, Rh, Ru, and Os, and Mn, or an antiferromagnetic material containing the element X, an element X' containing (where X' is at least one or two kinds of elements among Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, PO, and rare-earth elements), and Mn. For example, the antiferromagnetic layer 7 is formed of, for example, IrMn, PtMn, etc.

In the embodiment shown in FIG. 1, the fixed magnetic layer 8 is formed in a laminated ferrimagnetic structure. As shown in FIG. 1, the fixed magnetic layer 31 is configured such that a first magnetic layer 8a, a nonmagnetic intermediate layer 8b, and a second magnetic layer 31c are laminated in this order from the bottom. Magnetization of the first magnetic layer 8a and the second magnetic layer 8c are fixed in a state non-parallel to each other by an exchange-coupled magnetic field at an interface between each of the first and second magnetic layers and the antiferromagnetic layer 7 and by an antiferromagnetic exchange-coupled magnetic field (RKKY interaction) via the nonmagnetic intermediate layer 8b. The first magnetic layer 8a and the second magnetic layer 8c are formed of, for example, a ferromagnetic material, such as CoFe, NiFe, or CoFeNi. Also, the nonmagnetic intermediate layer 8b is formed of a nonmagnetic conductive material, such as Ru, Rh, Ir, Cr, Re, or Cu.

The insulating barrier layer 9 is formed of an insulating material, such as MgO or $Al_2O_3$. In one embodiment, at least a portion of the insulating barrier layer 9 is in a crystalline state. More preferably, the whole insulating barrier layer 9 is in a crystalline state. If the insulating barrier layer is in an amorphous state, the resistance changing rate ($\Delta R/R$) is not enhanced properly due to occurrence of electron diffusion when a tunnel current flows through the insulating barrier layer 9. Therefore, it is preferable that at least a portion of the insulating barrier layer 9 be in an amorphous state.

In one embodiment, the free magnetic layer 10 is composed of a soft magnetic layer formed of, for example, a magnetic material, such as an NiFe alloy, and an enhancement layer which is made of, for example, a CoFe alloy, between the soft magnetic layer and the insulating barrier layer 9. In one embodiment, the soft magnetic layer is formed of a magnetic material having an excellent soft magnetic property, and it is preferable that the enhancement layer be formed of a magnetic material having a greater spin polarizability than the soft magnetic layer. By forming the enhancement layer of a magnetic layer having a great spin polarizability, the resistance changing rate ($\Delta R/R$) can be enhanced. The Heusler alloy may be used for the enhancement layer.

The protective layer 11 is formed of a nonmagnetic conductive material, for example, Ta.

As shown in FIG. 1, both end surfaces 5a of the laminate 5 in the track width direction (X-direction) are formed with inclined surfaces such that the dimension of the width of the laminate 5 in the track width direction is gradually reduced upward from the bottom.

As shown in FIG. 1, a lower insulating layer 12 is formed over the lower shielding layer 1 and both the end surfaces 5a of the laminate 5, a hard bias layer 13 is formed on the lower insulating layer 12, and an upper insulating layer 14 is formed on the hard bias layer 13. The insulating layers 12 and 14 are formed of, for example, $Al_2O_3$, or $SiO_2$. The hard bias layer 13 is formed of a CoPt (Cobalt-Platinum) alloy or a CoCrPt (Cobalt-Chrome-Platinum) alloy.

An upper shielding layer (upper electrode layer) 18 formed of, for example, an NiFe alloy, is formed on the laminate 5 and the upper insulating layer 14.

In one embodiment, the lower shielding layer 1 and the upper shielding layer 18 function as electrode layers for the laminate 5 that constitute the tunnel-type magnetic detecting device 4. A tunnel current flows through in a direction (direction parallel to the Z-direction in the drawing) perpendicular to a film surface of each layer of the laminate 5.

In one embodiment, as shown in FIG. 1, the free magnetic layer 10 is supplied with a bias magnetic field from the hard bias layer 13 and is thereby magnetized in a direction parallel to the track width direction (X-direction in the drawing) in a state where there is no influence of an external magnetic field. Alternatively, the first fixed magnetic layer 8a and the second fixed magnetic layer 8c are magnetized in a direction parallel to the height direction (Y-direction in the drawing). Since the fixed magnetic layer 8 has a laminated ferrimagnetic structure, the first fixed magnetic layer 8a and the second fixed magnetic layer 8c are magnetized non-parallel to each other. Although the magnetization of the fixed magnetic layer 8 is fixed (the magnetization direction is not changed depending on an external magnetic field), the magnetization direction of the free magnetic layer 10 changes depending on an external magnetic field.

If the magnetization direction of the free magnetic layer 10 changes depending on an external magnetic field, when the magnetization direction of the second fixed magnetic layer 8c and the magnetization direction of the free magnetic layer 10 are non-parallel to each other, a tunnel current hardly flows through the insulating barrier layer 9 provided between the second fixed magnetic layer 8c and the free magnetic layer 10, and consequently the resistance value of the laminate is maximized.

Alternatively, when the magnetization direction of the second fixed magnetic layer 8c and the magnetization direction of the free magnetic layer 10 are parallel to each other, the tunnel current flows through the insulating barrier layer most easily, and consequently the resistance value of the laminate is minimized.

Using this principle, the magnetization direction of the free magnetic layer 10 changes under the influence of an external magnetic field, and an electrical resistance, which varies with this change is obtained as a voltage change, so that a leaking magnetic field from a recording medium can be detected.

The characteristic parts of the tunnel-type magnetic detecting device 4 in the present embodiment will now be described below.

As shown in FIG. 1, the seed layer 6 is formed in a two-layer structure in which the Al layer 17 is laminated on the NiFeCr layer 27. The antiferromagnetic layer 7, which constitutes the magnetoresistive effect part 15, is formed directly on the seed layer 6.

By forming the seed layer 6 in the two-layer structure of the NiFeCr layer 16 and Al layer 17, the surface roughness of the insulating barrier layer 9 can be reduced effectively as compared with the related art in which a seed layer is formed in a single-layer structure of an NiFeCr layer.

The NiFeCr layer 16 is provided so that it can exhibit a seed effect. Here, the 'seed effect' means enhancing crystallinity, and particularly means that the crystals oriented in a direction (parallel to the X-Y plane) parallel to a film surface of the antiferromagnetic layer 7 to be formed on the seed layer 6 are preferentially oriented to the [111] plane (closest-packed plane of the antiferromagnetic layer 7). Moreover, the crystals oriented in a direction (parallel to the X-Y plane) parallel to a film surface of each layer on the antiferromagnetic layer 7 may be preferentially oriented to the [111] plane.

Alternatively, in one embodiment, there is little seed effect in the Al layer 17. Therefore, it is preferable that the NiFeCr layer 16 exhibit the seed effect properly even in a single-layer structure. The film thickness of the NiFeCr layer 16 is within a range of 38 Å to 50 Å, and the NiFeCr layer 16 is expressed by the following compositional formula: $\{Ni_xFe_{1-x}\}_yCr_{100-y}$. In this embodiment, it is preferable that Ni ratio 'x' be within a range of 0.7 to 1, and the at % 'y' is formed from NiFeCr within a range of 25 at % to 45 at %. In addition, the 'Ni ratio x' is expressed by atomic % of Ni/(atomic* of of Ni+atomic % of Fe). For example, the NiFeCr layer 16 is formed from $\{Ni_{0.8}Fe_{0.2}\}_{60at\%}Cr_{40at\%}$.

In one embodiment, the NiFeCr layer 16 can exhibit the seed effect properly, and make the crystal orientation property of the magnetoresistive effect part 15 excellent.

In one embodiment, the Al layer 17 is formed on the NiFeCr layer 16 and plays a role to improve the smoothness of the surface of the seed layer 6. The Al layer 17 improves the interface smoothness between itself and the antiferromagnetic layer 7 to be formed thereon, and thereby the surface roughness of the insulating barrier layer 9 can be reduced properly. As an index of the surface roughness, the 'centerline average roughness (Ra)' is used.

Since the Al layer 17 has a reduced smoothing effect if it is very thin, it requires a certain degree of film thickness. It is preferable that the film thickness of the Al layer 17 be within a range 6 to 10 Å. More preferably, the film thickness of the Al layer is within a range of 8 to 10 Å.

As the surface roughness of the insulating barrier layer 9 becomes smaller, the resistance changing rate ($\Delta R/R$) can be enhanced effectively than before. Also, as the smoothness is enhanced, an interlayer-coupling magnetic field (Hin) which acts between the free magnetic layer 10 and the fixed magnetic layer 8 becomes smaller, and as a result of that, the asymmetry can be reduced.

Incidentally, by using the seed layer 6 in which the Al layer 17 is laminated on the NiFeCr layer 16, the resistance of the device increases as compared with the related art in which a seed layer is formed in a single-layer structure of an NiFeCr layer. However, the merit that the surface roughness of the insulating barrier layer 9 becomes smaller is much greater in the tunnel-type magnetic detecting device 4 than the demerit that the resistance of the device increases. For example, in a CIP-GMR element (GMR that a current flows in a direction parallel to a film surface of the device), if the seed layer 6 is formed to have a large film thickness, the loss of diversion to the seed layer 6 increases, and consequently the resistance changing rate ($\Delta R/R$) may decline greatly. Thus, the seed layer 6 was formed as thinly as possible. However, in the tunnel-type magnetic detecting device 4 according to the present embodiment, even if the seed layer 6 is formed to have a smaller thickness than before, making the surface roughness of the insulating barrier layer 9 smaller than as before is preferable in that the MR property can be improved further.

In the present embodiment, the surface roughness of the insulating barrier layer 9 can be reduced simply and properly by changing the structure of the seed layer 6. Therefore, the surface roughness of the insulating barrier layer 9 can be reduced stably as compared with a case where the surface roughness of the insulating barrier layer 9 is adjusted by adjusting the film thickness of the insulating barrier layer 9, or the like. Accordingly, according to the tunnel-type magnetic detecting device of the present embodiment, it is possible to obtain the MR property typified by a stable and excellent resistance changing rate ($\Delta R/R$).

Figure 2:
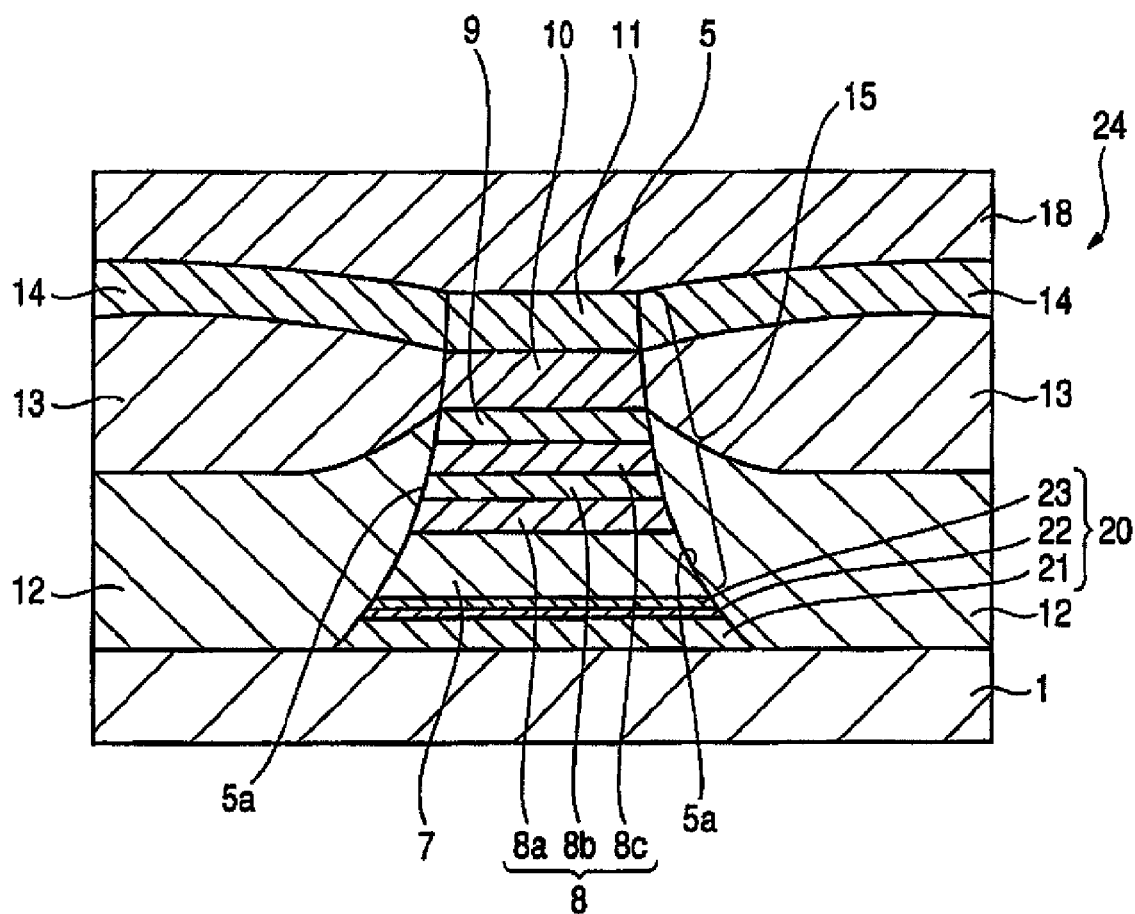
FIG. 2 is a sectional view of the structure of one embodiment of a thin film magnetic head including a tunnel-type magnetic detecting device.
Figure 2:
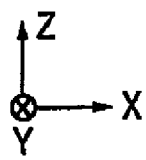

In one embodiment, as shown in FIG. 2, the seed layer 20 to be used in the tunnel-type magnetic detecting device 24 is formed in a three-layer structure of an NiFeCr layer 21, a Co layer 22, and an Al layer 23. Even by such a structure, the surface roughness of the insulating barrier layer 9 can be reduced as compared with the related art in which a seed layer is formed in a single-layer structure of an NiFeCr layer. The arrangement of FIG. 2 is different than that of FIG. 1.

As shown in FIG. 2, if the Co layer 22 is provided between the NiFeCr layer 21 and the Al layer 23, reorientation of the atoms in the NiFeCr layer 21 is caused even if the NiFeCr layer 21 is formed to have a smaller film thickness than before, and thereby the [111] orientation property of the NiFeCr layer 21 is improved sufficiently. In one embodiment, it is preferable that the NiFeCr layer 21 shown in FIG. 2 be formed to have a film thickness of 38 Å or less. If the film thickness is 38 Å or less, in a single-layer structure of the NiFeCr layer, the crystallinity is insufficient and the seed effect declines greatly. However, in the present embodiment, it is believed that the crystallinity is improved further and the seed effect is improved, by laminating the Co layer 22 on the NiFeCr layer 21 having such insufficient crystallinity, thereby promoting reorientation of the atoms in the NiFeCr layer 21.

In one embodiment, the film thickness of the Co layer 22 may be about 4 to 6 Å. It is preferable that the film thickness of the Al layer 23 is within a range of 6 to 10 Å, similarly to FIG. 1. It is more preferable that the film thickness of the Al layer 23 is within a range of 6 to 8 Å.

Even in the embodiment of FIG. 2, the surface roughness of the insulating barrier layer 9 can be reduced simply and properly by changing the structure of the seed layer 6 similarly to FIG. 1. Therefore, the surface roughness of the insulating barrier layer 9 can be reduced stably as compared with a case where the surface roughness of the insulating barrier layer 9 is adjusted by adjusting the film thickness of the insulating barrier layer 9, or the like. In one embodiment, it is possible to obtain the MR property typified by a stable and excellent resistance changing rate ($\Delta R/R$).

As described above, the Al layer 17, 23 or the Co layer 22 is formed to have a significant small film thickness. In one embodiment, diffusion of elements occurs between the Al layer 17, 23 or the Co layer 22 and the underlying NiFeCr layer 21 or the overlying antiferromagnetic layer 7 due to thermal influence or the like.

Figure 3:
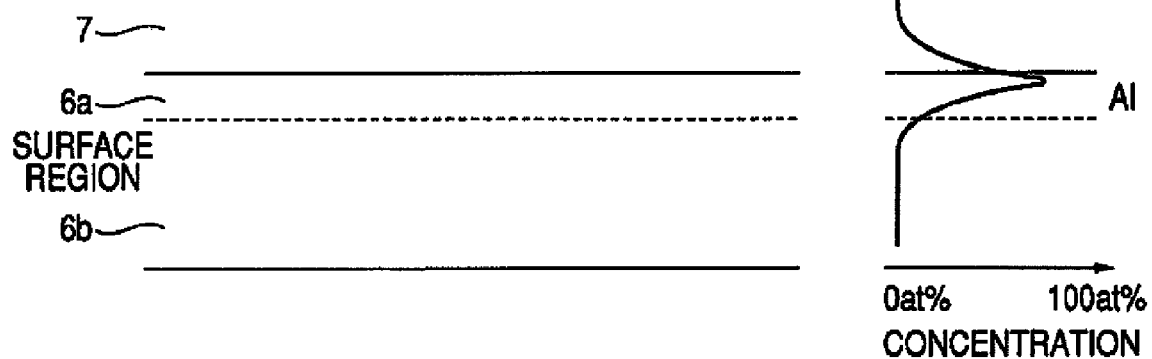
FIG. 3 is a partially enlarged schematic view showing one embodiment of a seed layer and an antiferromagnetic layer thereon in the tunnel-type magnetic detecting device shown in FIG. 1 in an enlarged manner, and a distribution chart showing the Al concentration of the seed layer and antiferromagnetic layer.

In one embodiment, as shown in FIG. 3, the seed layer 6 is formed mainly of NiFeCr, and a concentration gradient that the concentration of Al becomes gradually higher from a seed region 6b below a surface region 6a of the seed layer 6 to the interior of the surface region 6a may exist in the seed region 6. In FIG. 3, the average concentration of Al of the surface region 6a is higher than the average concentration of Al of the underlying seed layer 6. As shown in FIG. 3, the peak of Al concentration exists in the surface region 6a. The concentration of Al declines gradually from the middle of the surface region 6a to the interior of the antiferromagnetic layer 7.

Figure 4:
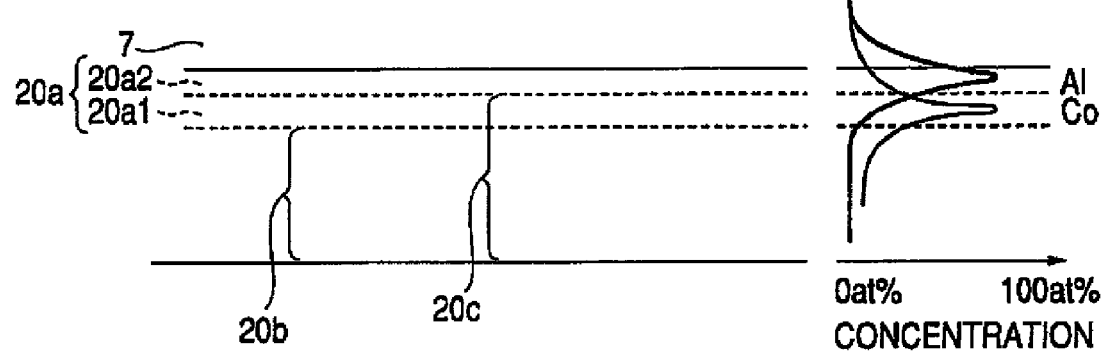
FIG. 4 is a partially enlarged schematic view showing one embodiment of a seed layer and an antiferromagnetic layer thereon in the tunnel-type magnetic detecting device shown in FIG. 2 in an enlarged manner, and a distribution chart showing the Al concentration and Co concentration of the seed layer and antiferromagnetic layer.

In one alternative embodiment, as shown in FIG. 4, the seed layer 20 is formed mainly of NiFeCr, and may be in a form in which a high-concentration Co region 20a1 and a high-concentration Al region 20a2 (on the high-concentration Co region 20a1) exists in a surface region 20a of the seed layer 20. A concentration gradient that the concentration of Co becomes gradually higher from a seed region 20b below the high-concentration Co region 20a1 to the interior of the high-concentration Co region 20a1 and a concentration gradient that the concentration of Al becomes gradually higher from a seed region 20c below the high-concentration Al region 20a2 to the interior of the high-concentration Co region 20a2 may exist in the seed region 20.

In one embodiment, as shown in FIG. 4, the average concentration of Co in the high-concentration Co region 20a1 is higher than that in the seed region 20b below the high-concentration Co-region 20a1. The average concentration of Al in the high-concentration Al region 20a2 is higher than that in the seed region 20c below the high-concentration Al region 20a2. As shown in FIG. 4, the peak of Co concentration exists within the high-concentration Co region 20a1, and the concentration of Co declines gradually from the middle of the high-concentration Co region 20a1 to the interior of the antiferromagnetic layer 7. The peak of Al concentration exists within the high-concentration Al region 20a2, and the concentration of Al declines gradually from the middle of the high-concentration Al region 20a2 to the interior of the antiferromagnetic layer 7.

The 'surface region' indicates a region in the vicinity of the surface of the seed layer 6, 20. The 'surface region' exists at least above the center of the film thickness. It is preferable that the surface region 6a in FIG. 3 be within a range of 6 to 10 Å downward from the surface of the seed layer 6. Alternatively, it is preferable that the surface region 20a is within a range of 10 to 16 Å downward from the surface of the seed layer 20.

Nano-beam property X-ray analysis (Nano-beam EDX) using a SIMS analyzer or a field-emission transmission electron microscopy (FE-TEM) is used for analysis of composition.

A method of manufacturing the tunnel-type magnetic detecting device will now be described. A seed layer 6 formed in a two-layer structure of an NiFeCr layer 16 and an Al layer 17 is formed on a lower gap layer 1 (embodiment of FIG. 1). Otherwise, a seed layer 20 formed in a three-layer structure of an NiFeCr layer 21, a Co layer 22, and an Al layer 23 is formed on a lower gap layer 20 (embodiment of FIG. 2).

In one embodiment, a magnetoresistive effect part 15 composed of an antiferromagnetic layer 7, a fixed magnetic layer 8, a insulating barrier layer 9, a free magnetic layer 10, and a protective layer 11 is formed on the seed layer 6, 20. In one embodiment, where the seed layer 6 is formed in the two-layer structure, it is preferable that the NiFeCr layer 16 is formed within a film thickness range of 38 Å to 50 Å. The Al layer 17 is formed within a film thickness range of 6 Å to 10 Å. In one embodiment, it is preferable that the Al layer 17 is formed within a film thickness range of 8 Å to 10 Å. Also, in a embodiment where the seed layer 20 is formed in the three-layer structure, it is preferable that the NiFeCr layer 21 be formed in a film thickness range of 30 Å to 38 Å, and the Co layer 22 be formed in a film thickness range of 4 Å to 6 Å, and the Al layer 23 is formed in a film thickness range of 6 Å to 10 Å. Also, it is more preferable that the Al layer 23 is formed in a film thickness range of 6 Å to 8 Å. When heat treatment is performed in a manufacturing process, for example, heat treatment in a magnetic field is performed in order to generate an exchange-coupled magnetic field (Hex) between the antiferromagnetic layer 7 and the fixed magnetic layer 8, the elements constituting the seed layer 6, 20 are diffused, but a high-concentration Al region (in the case where the seed layer 6 is formed in the two-layer structure of the NiFeCr layer 16 and Al layer 17), or a high-concentration Co region 20a1 and a high-concentration Al region 20a2 (in the case where the seed layer 20 is formed in the three-layer structure of the NiFeCr layer 21, Co layer 22, and Al layer 23) exist(s) in a surface region 20a of the seed layer 6.

In the other seed regions than the surface region 20a, NiFeCr as a main composition exists. Although the NiFeCr exists even in the surface region 20a, the concentration of the NiFeCr is significantly high in the other seed regions than the surface region 20a.

In one embodiment, after a laminate 5 formed from the seed layer 6, 20 and the magnetoresistive effect part 15 is machined in a substantially trapezoidal shape as shown in FIGS. 1 and 2, a lower insulating layer 12, a hard bias layer 13, and an upper insulating layer 14 are laminated in this order from the bottom on both sides of the laminate 5 in the track width direction (X-direction).

Then, an upper shielding layer 18 is formed on the protective layer 11 and the upper insulating 14.

EXAMPLES

A laminated film obtained by laminating substrate/InMn(55)/Co$_{70at\%}$Fe$_{30at\%}$/Ru(20) in this order from the bottom was formed. In addition, numerical numbers in parentheses represent film thicknesses, and the unit of the numbers is Å.

In this experiment, a laminated film in which the seed layer was laminated in the order of NiFeCr(42)/Al(8) from the bottom was prepared as Example 1, a laminated film in which the seed layer was laminated in the order of NiFeCr(38)/Co(4)/Al(8) from the bottom was prepared as Example 2, and a laminated film in which the seed layer was formed in a single-layer structure of NiFeCr was prepared as Comparative Example. In addition, numerical numbers in parentheses which are filled in the film configurations of the seed layers represent the film thicknesses of the layers, and the unit of the numbers is Å.

In the experiment, the centerline average roughness (Ra) of the surface of each of the laminated films in Examples 1 and 2 and Comparative Example, that is, the centerline average roughness of the surface of an Ru layer was obtained.

TABLE 1

|  | Comparative Example | Example 1 | Example 1 |
|---|---|---|---|
| Configuration of Seed Layer | NiFeCr | NiFeCr/Co/Al | NiFeCr/Al |
| Thickness of Each Layer | 42 | 38/4/8 | 42/8 |
| Ra (Å) | 0.27 | 0.233 | 0.182 |

As shown in Table 1, the centerline average roughness (Ra) of the Ru layer can be reduced more in Examples 1 and 2 than in Comparative Example.

As shown in the results of Table 1, although only the layers up to the Ru layer (nonmagnetic intermediate layer constituting the fixed magnetic layer) were laminated in the experiment, the surface roughness of each layer, particularly of the insulating barrier layer, to be formed above the Ru layer constituting the tunnel-type magnetic detecting device can be made smaller than Comparative Example by adopting a laminated structure of the seed layer shown in Examples 1 and 2.

A spin-valve-type thin film device having the following substrate film configuration was formed. The substrate film configuration from the bottom was as follows: substrate; NiFeCr; Not Formed, Al or Co/Al; InMn(55); CO$_{70at\%}$Fe$_{30at\%}$; Ru(9); Co(22); Cu(19); Co$_{90at\%}$Fe$_{10at\%}$ (12); Co$_{70at\%}$Fe$_{30at\%}$ (4); Ni$_{80at\%}$Fe$_{20at\%}$ (13); Co$_{90at\%}$Fe$_{10at\%}$ (3); and Ta(16). Numerical numbers in parentheses represent film thicknesses, and the unit of the numbers is Å.

In the experiment, spin-valve-type thin film devices in Comparative Example in which a seed layer is formed of NiFeCr only, Example 3 in which a seed layer is formed of NiFeCr/Al(6), Example 4 in which a seed layer is formed of NiFeCr/Al(8), Example 5 in which a seed layer is formed of NiFeCr/Al(10), Example 6 in which a seed layer is formed of NiFeCr/Co(4)/Al(6), Example 7 in which a seed layer is formed of NiFeCr/Co(4)/Al(8), and Example 8 in which a seed layer is formed of NiFeCr/Co(6)/Al(6) were formed, respectively (numerical numbers in parentheses represent film thicknesses, and the unit of the numbers is Å).

In each of the spin-valve-type thin film devices, the magnitude of an interlayer-coupling magnetic field (Hin) which acts between the free magnetic layer and the fixed magnetic layer when the total thickness of the seed layer was changed by changing the film thickness of NiFeCr was investigated. The results thereof are shown in FIG. 5.

Figure 5:
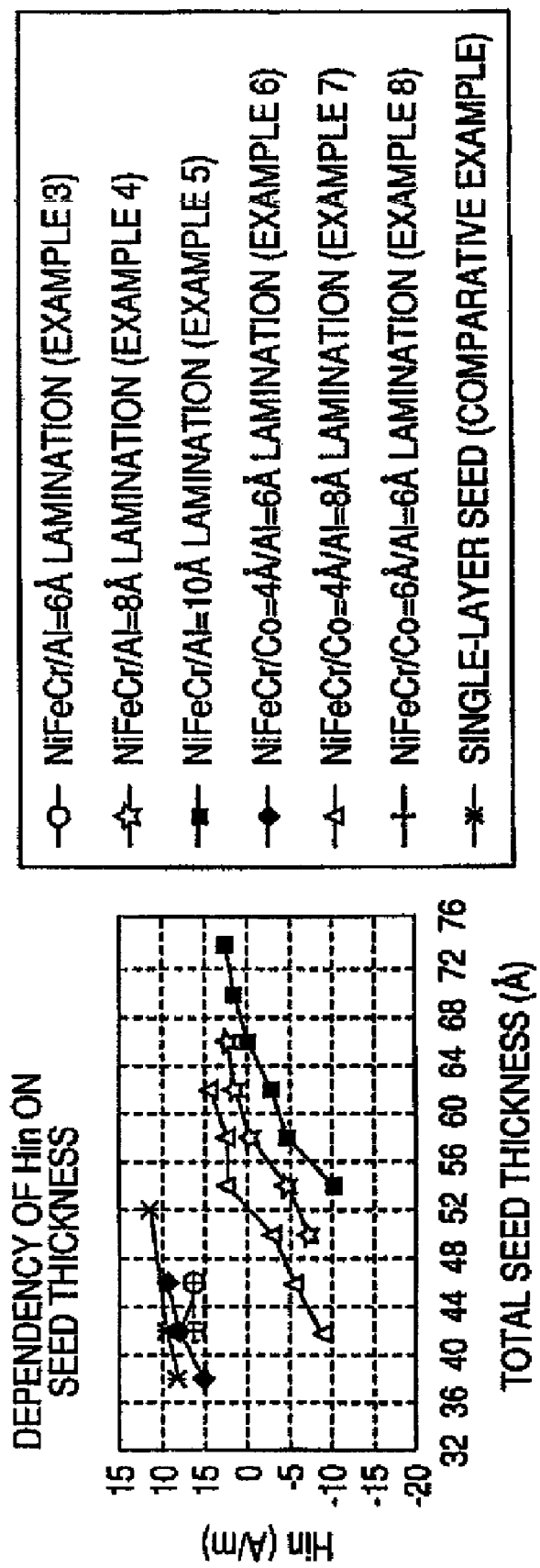
FIG. 5 is a graph showing the relationship between the total thickness of a seed layer in each of spin-valve-type thin film devices in Examples 3 and 8 and Comparative Example, and an interlayer-coupling magnetic field (Hin) which acts between a free magnetic layer and a fixed magnetic layer.

As shown in FIG. 5, the interlayer-coupling magnetic field (Hin) in the spin-valve-type thin film device according to Comparative Example becomes larger than those in the spin-valve-type thin film devices in the Examples.

In Examples 3 to 5, where a seed layer is formed in a laminated structure of NiFeCr/Al, it is preferable that the thickness of an Al layer is set to 8 to 10 Å. In Examples 6 to 8, where a seed layer is formed in a laminated structure of NiFeCr/Co/Al, it is preferable that the thickness of a Co layer is set to 4 to 6 Å, and the thickness of an Al layer is set to 6 to 8 Å.

In the spin-valve-type thin film devices used in the experiment of FIG. 5, a Cu layer was provided between the free magnetic layer and the fixed magnetic layer. However, if the seed layers in the above Examples are used, the absolute value of the interlayer-coupling magnetic field (Hin) can be reduced stably. This is because the interface of the fixed magnetic layer or free magnetic layer is planarized. If the seed layers are applied to a tunnel-type magnetic detecting device, planarization of the interface of the insulating barrier layer can be promoted. As shown in the experimental results of Table 1, the Ra of a film surface is reduced.

In the tunnel-type magnetic detecting device, the planarization of the insulating barrier layer is very important in stably obtaining an excellent resistance changing rate (ΔR/R). Based on the results of the experiment, using a laminated seed of NiFeCr/Al or NiFeCr/Co/Al is more preferable than using a single-layer seed of NiFeCr.

Various embodiments described herein can be used alone or in combination with one another. The forgoing detailed description has described only a few of the many possible implementations of the present invention. For this reason, this detailed description is intended by way of illustration, and not by way of limitation. It is only the following claims, including all equivalents that are intended to define the scope of this invention.

The invention claimed is:

1. A tunnel-type magnetic detecting device comprising:
a magnetoresistive effect part comprising an antiferromagnetic layer, fixed magnetic layer, an insulating barrier layer, and a free magnetic layer from the bottom, the free magnetic layer varying in magnetization by an external magnetic field; and
a seed layer provided below the magnetoresistive effect part,
wherein the seed layer includes an Al layer laminated on an NiFeCr layer, and the Al layer is disposed directly below the antiferromagnetic layer.

2. The tunnel-type magnetic detecting device according to claim 1, wherein at least a portion of the insulating barrier layer is in an amorphous state.

3. The tunnel-type magnetic detecting device according to claim 1, wherein the NiFeCr layer is expressed by the following compositional formula: $\{Ni_xFe_{1-x}\}_yCr_{100-y}$, where x is within a range of 0.7 to 1, and y is within a range of 25 to 45 at %.

4. The tunnel-type magnetic detecting device according to claim 1, wherein a film thickness of the Al layer is within a range of 6 to 10 Å.

5. The tunnel-type magnetic detecting device according to claim 1, wherein a film thickness of the surface region is within a range of 6 to 10 Å.

6. A tunnel-type magnetic detecting device comprising:
a magnetoresistive effect part comprising an antiferromagnetic layer, fixed magnetic layer, an insulating barrier layer, and a free magnetic layer from the bottom, the free magnetic layer varying in magnetization by an external magnetic field; and
a seed layer provided below the magnetoresistive effect part,
wherein the seed layer includes mainly NiFeCr, and the average concentration of Al in a surface region of the seed layer is higher than the average concentration of Al in a seed region below the surface region, and the surface region is directly below the antiferromagnetic layer.

7. The tunnel-type magnetic detecting device according to claim 6, wherein at least a portion of the insulating barrier layer is in an amorphous state.

8. The tunnel-type magnetic detecting device according to claim 6, wherein the NiFeCr layer is expressed by the following compositional formula: $\{Ni_xFe_{1-x}\}_yCr_{100-y}$, where x is within a range of 0.7 to 1, and y is within a range of 25 to 45 at %.

* * * * *